US009748442B2

(12) United States Patent
Schellhammer et al.

(10) Patent No.: US 9,748,442 B2
(45) Date of Patent: Aug. 29, 2017

(54) LIGHT EMITTING DIODES AND ASSOCIATED METHODS OF MANUFACTURING

(71) Applicant: Micron Technology, Inc., Boise, ID (US)

(72) Inventors: Scott D. Schellhammer, Meridian, ID (US); Scott E. Sills, Boise, ID (US); Lifang Xu, Boise, ID (US); Thomas Gehrke, Boise, ID (US); Zaiyuan Ren, Boise, ID (US); Anton J. De Villiers, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/510,914

(22) Filed: Oct. 9, 2014

(65) Prior Publication Data

US 2015/0028347 A1 Jan. 29, 2015

Related U.S. Application Data

(62) Division of application No. 12/703,660, filed on Feb. 10, 2010, now Pat. No. 8,859,305.

(51) Int. Cl.

| | |
|---|---|
| ***H01L 33/24*** | (2010.01) |
| ***H01L 33/00*** | (2010.01) |
| ***H01L 33/16*** | (2010.01) |
| ***H01L 33/22*** | (2010.01) |
| ***H01L 33/32*** | (2010.01) |

(52) U.S. Cl.

CPC ............ *H01L 33/24* (2013.01); *H01L 33/007* (2013.01); *H01L 33/16* (2013.01); *H01L 33/22* (2013.01); *H01L 33/32* (2013.01)

(58) Field of Classification Search

CPC ................................ H01L 33/24; H01L 33/22

See application file for complete search history.

(56) References Cited

U.S. PATENT DOCUMENTS

| | | | | |
|---|---|---|---|---|
| 6,576,932 | B2 | 6/2003 | Khare et al. | |
| 7,012,281 | B2 | 3/2006 | Tsai et al. | |
| 7,030,421 | B2 * | 4/2006 | Okuyama | H01L 33/24 257/102 |
| 7,427,772 | B2 | 9/2008 | Chuo et al. | |
| 7,476,909 | B2 | 1/2009 | Nagai et al. | |

(Continued)

OTHER PUBLICATIONS

Feezell, D.F. et al., Development of Nonpolar and Semipolar InGaN/GaN Visible Light-Emitting Diodes, MRS Bulletin, vol. 34, pp. 318-323, May 2009.

(Continued)

*Primary Examiner* — Amar Movva

(74) *Attorney, Agent, or Firm* — Perkins Coie LLP

(57) ABSTRACT

Light emitting diodes and associated methods of manufacturing are disclosed herein. In one embodiment, a light emitting diode (LED) includes a substrate, a semiconductor material carried by the substrate, and an active region proximate to the semiconductor material. The semiconductor material has a first surface proximate to the substrate and a second surface opposite the first surface. The second surface of the semiconductor material is generally non-planar, and the active region generally conforms to the non-planar second surface of the semiconductor material.

13 Claims, 4 Drawing Sheets

130
134
132
114
102
101
100

(56) References Cited

U.S. PATENT DOCUMENTS

| | | | |
|---|---|---|---|
| 7,598,105 | B2 | 10/2009 | Lee et al. |
| 8,134,163 | B2 | 3/2012 | Yu et al. |
| 2006/0094244 | A1 | 5/2006 | Yamada et al. |
| 2008/0277682 | A1 | 11/2008 | Mishra et al. |
| 2009/0008654 | A1 | 1/2009 | Nagai |
| 2009/0186435 | A1 | 7/2009 | Yeh et al. |
| 2009/0189172 | A1 | 7/2009 | Pan et al. |
| 2009/0286346 | A1 | 11/2009 | Adkisson et al. |
| 2009/0315013 | A1 | 12/2009 | Tansu et al. |
| 2010/0117070 | A1* | 5/2010 | Adekore ............. H01L 21/0237 257/43 |
| 2011/0193115 | A1 | 8/2011 | Schellhammer et al. |
| 2011/0233581 | A1 | 9/2011 | Sills et al. |

OTHER PUBLICATIONS

Zhang, X. et al., Enhancement of LED light extraction via diffraction of hexagonal lattice fabricated in ITO layer with holographic lithography and wet etching, Physics Letters A, vol. 372, Issue 20, May 12, 2008, pp. 3738-3740.

* cited by examiner

LIGHT EMITTING DIODES AND ASSOCIATED METHODS OF MANUFACTURING

CROSS-REFERENCE TO RELATED APPLICATION(S)

This application is a divisional of U.S. application Ser. No. 12/703,660 filed Feb. 10, 2010, now U.S. Pat. No. 8,859,305, which is incorporated herein by reference in its entirety.

TECHNICAL FIELD

The present technology is directed generally to light emitting diodes (LEDs) and associated methods of manufacturing.

BACKGROUND

Mobile phones, personal digital assistants (PDAs), digital cameras, MP3 players, and other portable electronic devices utilize LEDs for background illumination. FIG. 1 is a cross-sectional diagram of a portion of a conventional indium-gallium nitride (InGaN) LED 10. As shown in FIG. 1, the LED 10 includes a silicon substrate 12, an optional buffer material 13 (e.g., aluminum nitride), an N-type gallium nitride (GaN) material 14, an InGaN material 16, and a P-type GaN material 18 on top of one another in series. The LED 10 also includes a first contact 20 on the P-type GaN material 18 and a second contact 22 on the N-type GaN material 14.

One drawback of the LED 10 in FIG. 1 is that the surface area of the N-type GaN material 14 is limited, and thus only a limited amount of InGaN material 16 may be formed thereon. The limited surface area of the N-type GaN material 14 thus may limit the total power output of the LED 10. Also, the planar surface of the LED 10 may limit the light extraction efficiency of the LED 10 because it is believed that the light extraction efficiency may be generally enhanced via surface texturing and/or roughening. Accordingly, several improvements in increasing the light extraction efficiency of LEDs may be desirable.

DETAILED DESCRIPTION

Various embodiments of microelectronic substrates having LEDs formed thereon and associated methods of manufacturing are described below. The term "microelectronic substrate" is used throughout to include substrates upon which and/or in which microelectronic devices, micromechanical devices, data storage elements, read/write components, and other features are fabricated. A person skilled in the relevant art will also understand that the technology may have additional embodiments, and that the technology may be practiced without several of the details of the embodiments described below with reference to FIGS. 2A-3B.

Figure 2A:
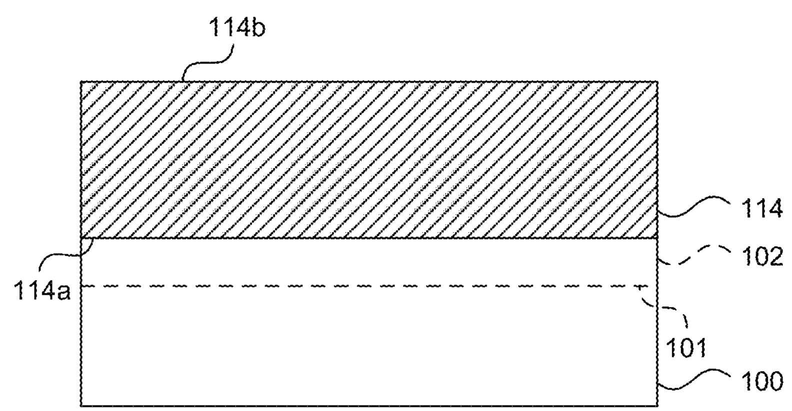
FIGS. 2A-2D are cross-sectional views of a portion of a microelectronic substrate undergoing a process of forming an LED in accordance with embodiments of the technology.
Figure 2B:
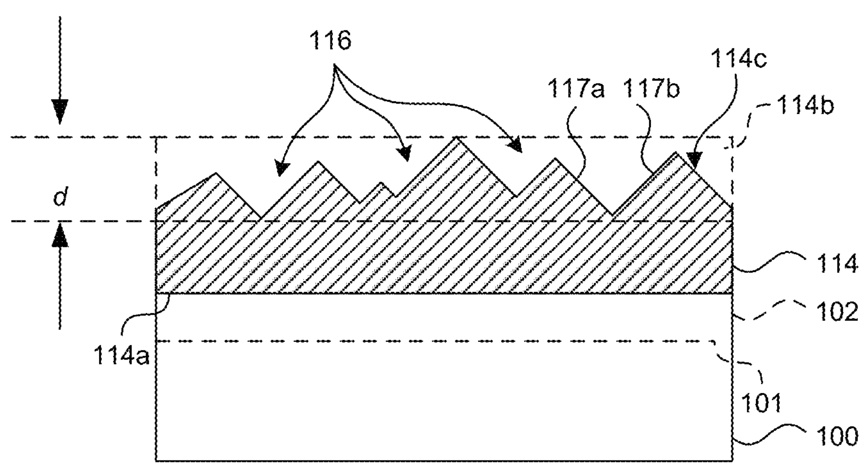

FIGS. 2A and 2B are cross-sectional views of a portion of a microelectronic substrate 100 undergoing a process of forming an LED in accordance with embodiments of the technology. In the illustrated embodiment shown in FIGS. 2A and 2B, the microelectronic substrate 100 includes a single crystalline silicon (Si) material. In other embodiments, the microelectronic substrate 100 may include sapphire ($Al_2O_3$), silicon carbide (SiC), and/or other suitable substrate materials in addition to or in lieu of a silicon material.

As shown in FIG. 2A, an optional initial stage of the process can include depositing a buffer material 102 (shown in phantom lines for clarity) on a surface 101 of the microelectronic substrate 100. In the following description, the microelectronic substrate 100 includes a silicon substrate for illustration purposes. In other embodiments, the microelectronic substrate 100 can also include sapphire ($Al_2O_3$), silicon carbide (SiC), and/or other suitable substrate materials.

In one embodiment, the buffer material 102 includes aluminum nitride (AlN) formed on the surface 101 via chemical vapor deposition (CVD), atomic layer deposition (ALD), and/or other suitable techniques. In other embodiments, the buffer material 102 can include aluminum gallium nitride (AlGaN) and/or other suitable buffer materials deposited via spin coating, CVD, ALD, and/or other suitable deposition techniques. In further embodiments, the buffer material 102 may be omitted.

The process can then include forming a first semiconductor material on the optional buffer material 102. In the following description, an N-type GaN material is used as an example of the first semiconductor material. In other embodiments, the first semiconductor material can include a P-type GaN material and/or other suitable cladding materials. Techniques for forming an N-type GaN material 114 can include metal organic CVD (MOCVD), molecular beam epitaxy (MBE), liquid phase epitaxy (LPE), and/or other suitable techniques. As shown in FIG. 2A, the N-type GaN material 114 has a first surface **114*a* proximate to the buffer material 102 and a second surface 114*b* opposite the first surface 114*a*. The second surface 114*b*** is generally planar at this stage of the process.

As shown in FIG. 2B, the process can include converting the generally planar second surface **114*b* of the N-type GaN material 114 into a textured surface 114*c* that is at least partially non-planar. In one embodiment, converting the generally planar second surface 114*b* to the textured surface 114*c* can include applying an etchant to the second surface 114*b* of the N-type GaN material 114**. The etchant can include an aqueous solution that contains at least one of phosphorous acid ($H_3PO_4$), potassium hydroxide (KOH), and/or other suitable etchant or a mixture thereof.

The etchant may then react with the N-type GaN material 114 such that a plurality of indentations 116 may be formed relative to the original elevation of the second surface **114*b* (shown in phantom in FIG. 2B). As a result, the textured surface 114*c* can have a roughness greater than that of the second surface 114*b*. The indentations 116 can individually have sloped surfaces 117*a* and 117*b* that converge toward the microelectronic substrate 100**.

In the illustrated embodiment, the plurality of indentations 116 can have a corrugated profile in FIG. 2B with a variable depth d from the original elevation of the second surface **114*b*. In one embodiment, a root-mean-square (RMS) $d_{RMS}$ of the depth d of the indentations 116** can be about 0.05 microns to about 3 microns, as defined below:

$$d_{RMS} = \sqrt{\frac{d_1^2 + d_2^2 + \ldots + d_n^2}{n}}$$

where n is a number of the indentations 116. In other embodiments, the RMS of the depth d can have other suitable values. In further embodiments, the textured surface 114*c* may also include at least one generally planar portion (not shown) between two adjacent indentations 116.

Figure 2C:
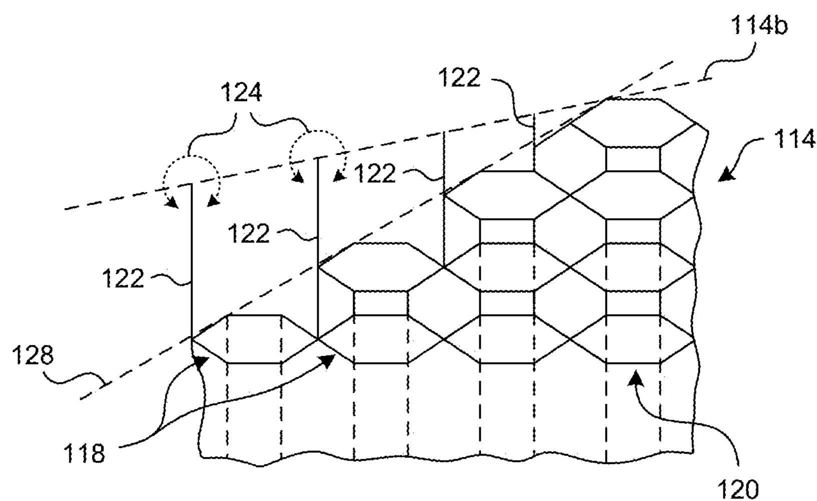

Without being bound by theory, it is believed that the etchant may remove material from the N-type GaN material 114 along lattice planes because of bonding energy differences in the GaN lattice structure. FIG. 2C is an enlarged schematic view of a portion of a lattice boundary for the N-type GaN material 114 in FIG. 2B. As shown in FIG. 2C, at the lattice boundary, the N-type GaN material 114 may include a Wurtzite lattice structure 120 in which layers of Ga and N atoms are bound together in hexagonal cells 118. The N-type GaN material 114 also includes a plurality of defects or dislocations 122 associated with the lattice structure 120. The dislocations 122 may include edge dislocations, screw dislocations, and/or a combination thereof. The dislocations 122 and the lattice structure 120 together define the textured surface 114*c* of the N-type GaN material 114.

It is believed that atoms (e.g., Ga or N atoms) associated with the dislocations 122 have lower bonding energy because these atoms are not bound on all sides to neighboring atoms like those in the lattice structure 120. As a result, when the etchant (generally designated by the arrows 124) contacts the boundary of the N-type GaN material 114, the etchant preferentially removes materials (e.g., Ga, N, or both) from the dislocations 122 instead of the lattice structure 120. Accordingly, the etchant can at least reduce the number of dislocations 122 at the lattice boundary of the N-type GaN material 114 and can form a lattice plane 128 along the lattice structure 120.

It is also believed that several factors may be adjusted to influence the non-planar area on the textured surface 114*c* of the N-type GaN material 114 as well as the shape, dimension, and/or other characteristics of the indentations 116. For example, the factors may include a thickness of the microelectronic substrate 100, the period of time the etchant contacts the N-type GaN material 114, an average percentage of defect of the N-type GaN material 114, the etchant concentration, an operating temperature, and/or other suitable factors. Thus, an operator may adjust at least one of the foregoing factors such that the textured surface 114*c* is completely non-planar or only partially non-planar.

It is further believed that the defect characteristics of the N-type GaN material 114 may influence the distribution, overlap, dimensions, and/or other characteristics of the indentations 116 on the textured surface 114*c* of the N-type GaN material 114. As a result, the operator may control the distribution, overlap, dimensions, and/or other characteristics of the indentations 116 by controlling the defect characteristics of the N-type GaN material 114 by, e.g., annealing the formed N-type GaN material 114 or forming the N-type GaN material 114 with MBE, LPE, and/or other deposition techniques.

Figure 2D:
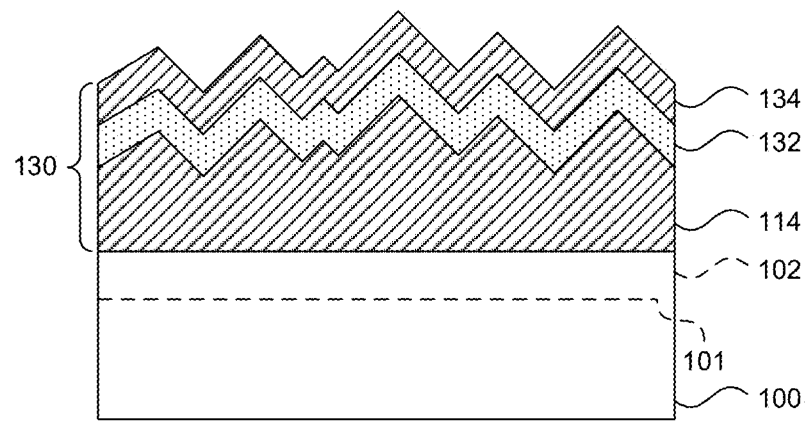

As shown in FIG. 2D, the process can include forming an LED structure 130 on the microelectronic substrate 100 by forming an active region and a second semiconductor material in series on the microelectronic substrate 100. In the illustrated embodiment, the active region includes an InGaN material and/or an InGaN/GaN multiple quantum wells (hereinafter collectively referred to as the InGaN material 132), and the second semiconductor material includes a P-type GaN material 134 (e.g., magnesium doped). The InGaN material 132 and the P-type GaN material 134 generally conform to the N-type GaN material 114. In other embodiments, at least one of the InGaN material 132 and the P-type GaN material 134 can at least partially coalesce on the N-type GaN material 114 (e.g., by joining neighboring portions of the same material). As a result, at least one of the InGaN material 132 and the P-type GaN material 134 may have a generally planar surface. In further embodiments, the process can also include forming a mirror layer (e.g., aluminum, not shown) and a support structure (e.g., a silicon and/or silicon oxide material, not shown) on the LED structure 130. In yet further embodiments, the process can include optionally cleaning the microelectronic substrate 100 with the N-type GaN material 114 with deionized water, a dilute solution of ammonium hydroxide, and/or other suitable cleaning agents.

Figure 1:
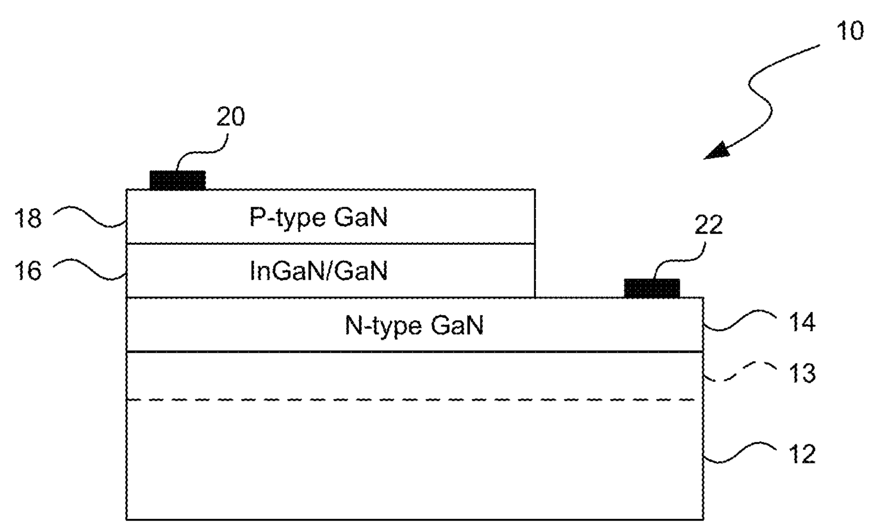
FIG. 1 is a cross-sectional view of a portion of an LED in accordance with the prior art.

Several embodiments of the process discussed above with reference to FIGS. 2A-2D can increase the amount of light generated from the LED structure 130 because the indentations 116 can increase the area upon which the InGaN material 132 may be formed. As a result, the surface area of the quantum wells per area of the N-type GaN material 114 may be increased compared to the prior art structure shown in FIG. 1.

Even though the LED structure 130 is discussed above as having the N-type GaN material 114, the InGaN material 132, and the P-type GaN material 134, in other embodiments, forming the LED structure 130 can also include depositing at least one of gallium arsenide (GaAs), aluminum gallium arsenide (AlGaAs), gallium arsenide phosphide (GaAsP), aluminum gallium indium phosphide (AlGaInP), gallium(III) phosphide (GaP), zinc selenide (ZnSe), boron nitride (BN), aluminum nitride (AlN), aluminum gallium nitride (AlGaN), aluminum gallium indium nitride (AlGaInN), and/or other suitable semiconductor materials.

Figure 3A:
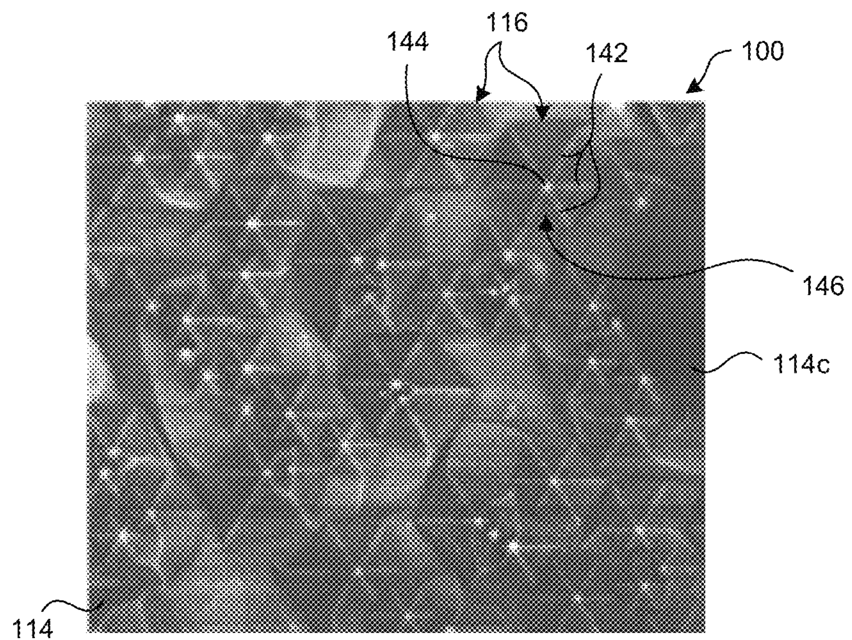
FIGS. 3A and 3B are examples of top views of a portion of a microelectronic substrate undergoing the process of forming an LED shown in FIGS. 2A-2D in accordance with embodiments of the technology.
Figure 3B:
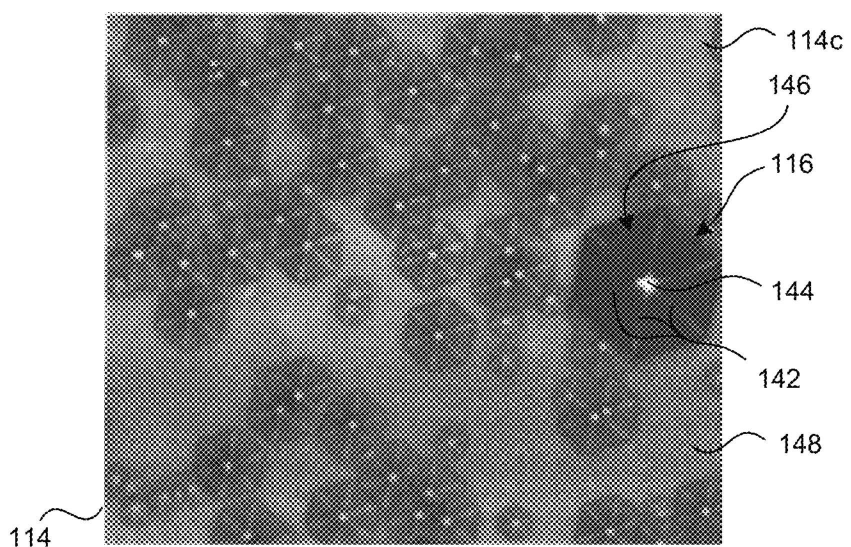

Experiments were conducted based on several embodiments of the process discussed above with reference to FIGS. 2A-2D. FIGS. 3A and 3B are examples of top views of a portion of a microelectronic substrate 100 after converting the second surface 114*b* of the N-type GaN material 114 into an at least partially non-planar textured surface. As shown in both FIGS. 3A and 3B, the indentations 116 individually include an inverted pyramid shape with a hexagonal base and six sloped triangular surfaces 146 along lattice planes of the N-type GaN material 114 that converge at an apex 144. Two adjacent surfaces 146 form a generally linear edge 142. The indentations 116 can have different sizes (e.g., a base perimeter, a depth, etc.) and may also overlap with one another.

The indentations 116 can also occupy different amounts of area on the textured surface 114*c*. As shown in FIG. 3A, the textured surface 114*c* of the N-type GaN material 114 is completely non-planar because the indentations 116 occupy generally the entire area of the textured surface 114*c*. In contrast, as shown in FIG. 3B, the textured surface 114*c* of the N-type GaN material 114 is only partially non-planar as the textured surface 114*c* includes planar areas 148 that do not include any indentations 116.

From the foregoing, it will be appreciated that specific embodiments of the technology have been described herein for purposes of illustration, but that various modifications may be made without deviating from the technology. For example, even though converting the generally planar second surface 114*b* of the N-type GaN material 114 is discussed above as utilizing a wet chemistry, in other embodiments, the generally planar second surface 114*b* of the N-type GaN material 114 may also be converted by utilizing reactive ion etch, physical sputtering, and/or other suitable material removal techniques. Such techniques may be integrated with the GaN/InGaN material deposition process (e.g., within a MOCVD chamber) to enable in-situ sequential epitaxial growth/etching/epitaxial growth without breaking vacuum. In other embodiments, these material removal techniques may be implemented independent of the GaN/InGaN material deposition process. Many of the elements of one embodiment may be combined with other embodiments in addition to or in lieu of the elements of the other embodiments. Accordingly, the technology is not limited except as by the appended claims.

We claim:

1. A light emitting diode (LED), comprising:

a substrate;

a semiconductor material carried by the substrate, the semiconductor material having— a first major surface facing toward the substrate, a second major surface opposite to the first major surface and further from the substrate than the first major surface, indentations in a non-uniform arrangement at different respective crystal dislocations within the semiconductor material, wherein the indentations taper inwardly toward the substrate, and a planar region extending between the indentations at the second major surface; and an active region directly contacting the semiconductor material at the second major surface, wherein the active region conforms to the indentations.

2. The LED of claim 1 wherein:

a given one of the indentations has a hexagonal portion; and the given indentation tapers inwardly from the hexagonal portion toward the substrate.

3. The LED of claim 1 wherein:

a given one of the indentations has sidewalls extending toward the substrate; and the sidewalls extend along different respective crystal planes of the semiconductor material.

4. The LED of claim 1 wherein:

the semiconductor material contains an N-type gallium nitride (GaN) material;

the active region includes an indium gallium nitride (InGaN) material epitaxially formed on the semiconductor material; and the LED further comprises a P-type GaN material epitaxially formed on the active region.

5. The LED of claim 1 wherein a given one of the indentations has six sidewalls that converge at an apex.

6. The LED of claim 1 wherein the indentations have a root-mean-square depth within a range from 0.05 micron to 3 microns.

7. The LED of claim 1, further comprising a buffer material between the substrate and the semiconductor material.

8. A light emitting diode (LED), comprising:

a substrate;

a semiconductor material carried by the substrate, the semiconductor material having— a first major surface facing toward the substrate, a second major surface opposite to the first major surface and further from the substrate than the first major surface, indentations aligned with a pattern of crystal dislocations within the semiconductor material, and a planar region extending between the indentations at the second major surface; and an active region directly contacting the semiconductor material at the second major surface, wherein the active region conforms to the indentations.

9. The LED of claim 8 wherein:

a given one of the indentations has a hexagonal portion; and the given indentation tapers inwardly from the hexagonal portion toward the substrate.

10. The LED of claim 8 wherein:

a given one of the indentations has sidewalls extending toward the substrate; and the sidewalls extend along different respective crystal planes of the semiconductor material.

11. The LED of claim 8 wherein a given one of the indentations has six sidewalls that converge at an apex.

12. The LED of claim 8 wherein the indentations have a root-mean-square depth within a range from 0.05 micron to 3 microns.

13. The LED of claim 8, further comprising a buffer material between the substrate and the semiconductor material.

* * * * *